United States Patent
Dizdar (10) Patent No.: US 11,374,593 B2
(45) Date of Patent: Jun. 28, 2022

(54) HARDWARE COMPLEXITY REDUCTION TECHNIQUE FOR SUCCESSIVE CANCELLATION LIST DECODERS

(71) Applicant: ASELSAN ELEKTRONIK SANAYI VE TICARET ANONIM SIRKETI, Ankara (TR)

(72) Inventor: Onur Dizdar, Ankara (TR)

(73) Assignee: ASELSAN ELEKTRONIK SANAYI VE TICARET ANONIM SIRKETI, Ankara (TR)

( * ) Notice: Subject to any disclaimer, the term of this patent is extended or adjusted under 35 U.S.C. 154(b) by 0 days.

(21) Appl. No.: 17/287,534

(22) PCT Filed: Nov. 23, 2018

(86) PCT No.: PCT/TR2018/050718
§ 371 (c)(1),
(2) Date: Apr. 22, 2021

(87) PCT Pub. No.: WO2020/106230
PCT Pub. Date: May 28, 2020

(65) Prior Publication Data
US 2021/0399741 A1    Dec. 23, 2021

(51) Int. Cl.
*H03M 13/13* (2006.01)
*H03M 13/45* (2006.01)
*H03M 13/00* (2006.01)

(52) U.S. Cl.
CPC ........... *H03M 13/13* (2013.01); *H03M 13/45* (2013.01); *H03M 13/6502* (2013.01)

(58) Field of Classification Search
CPC ..... H04L 1/0045; H04L 1/005; H04L 1/0047; H04L 65/60; H03M 13/45;
(Continued)

(56) References Cited

U.S. PATENT DOCUMENTS

2016/0056843 A1    2/2016  Gross et al.
2017/0149531 A1*   5/2017  Raza ............... H03M 13/37
(Continued)

FOREIGN PATENT DOCUMENTS

KR    101600759 B1    3/2016

OTHER PUBLICATIONS

Youzhe Fan, et al., A Low-Latency List Successive-Cancellation Decoding Implementation for Polar Codes, IEEE Journal on Selected Areas in Communications, 2016, pp. 303-317, vol. 34 No. 2.
(Continued)

*Primary Examiner* — Thien Nguyen
(74) *Attorney, Agent, or Firm* — Bayramoglu Law Offices LLC (57) ABSTRACT

A hardware complexity reduction method for successive cancellation list decoders (SCL) is provided. In path pruning stages of an SCL decoding, L paths with smallest path metrics out of 2L candidate paths are chosen as surviving candidate paths as in a conventional SCL algorithm. Moreover, path indexes of L surviving candidate paths are provided in a sorted manner according to indexes at an output of a sorter module. After a path pruning, instead of L-to-1 multiplexers, (L/2+1)-to-1 multiplexers are deployed to perform copying operations of any required elements stored in dedicated registers of the L surviving candidate paths.

7 Claims, 6 Drawing Sheets

(58) Field of Classification Search
CPC ............. H03M 13/3746; H03M 13/63; H03M 13/6325; H03M 13/1111; H03M 13/3905; H03M 13/4138; H04N 7/22
See application file for complete search history.

(56) References Cited

U.S. PATENT DOCUMENTS

| | | | |
|---|---|---|---|
| 2017/0366204 A1 | 12/2017 | Shi et al. | |
| 2018/0287640 A1* | 10/2018 | Lin | .................. H03M 13/6502 |
| 2020/0127680 A1* | 4/2020 | Kim | .................. H03M 7/3059 |

OTHER PUBLICATIONS

Kai Chen, et al., A Reduced-Complexity Successive Cancellation List Decoding of Polar Codes, 2013, IEEE.

Alexios Balatsoukas-Stimming, et al., Hardware Architecture for List Successive Cancellation Decoding of Polar Codes, IEEE Transactions on Circuits and Systems II: Express Briefs, 2014, pp. 609-613, vol. 61 No. 8, IEEE.

Alexios Balatsoukas-Stimming, et al., LLR-Based Successive Cancellation List Decoding of Polar Codes, IEEE Transactions on Signal Processing, 2015, pp. 5165-5179, vol. 63 No. 19.

Ji Chen, et al., Low-Complexity List Successive-Cancellation Decoding of Polar Codes Using List Pruning, 2016 IEEE Global Communications Conference, 2016, pp. 1-6.

Alexios Balatsoukas-Stimming, et al., On Metric Sorting for Successive Cancellation List Decoding of Polar Codes, IEEE International Symposium on Circuits and Systems, 2015, pp. 1993-1996.

* cited by examiner

HARDWARE COMPLEXITY REDUCTION TECHNIQUE FOR SUCCESSIVE CANCELLATION LIST DECODERS

CROSS REFERENCE TO THE RELATED APPLICATIONS

This application is the national stage entry of International Application No. PCT/TR2018/050718, filed on Nov. 23, 2018, the entire contents of which are incorporated herein by reference.

TECHNICAL FIELD

The present invention relates to the field of communication and particularly to architectures of decoders for polar codes.

BACKGROUND

Polar coding is a linear block coding method that is proved to achieve Shannon's channel capacity for any symmetric binary-input discrete memoryless channel (B-DMC) by Erdal Arikan.

Block length of a polar code is represented by $N=2^n$, where n is a positive integer. An uncoded bit vector of length-N consists of information bits and frozen bits. The number of information bits is represented by K. The number of frozen bits is given by N−K. The code rate is represented by R=K/N.

For generic N, the encoding operation of polar codes can be written in vector-matrix multiplication form as:

$$x = uGN$$

The generator matrix, GN, is defined as $GN = BNF^{\otimes m}$, where $$F = \begin{bmatrix} 1 & 0 \\ 1 & 1 \end{bmatrix}$$

and $F^{\otimes m}$ is m-th Kronecker power of the kernel matrix F. The matrix BN is the bit-reversal matrix for a vector of length-N. If the binary representation of an integer $k \in \{0, \ldots, N-1\}$ is denoted by $(i_0, \ldots, i_{n-1})$, the elements of vectors a and b of length-N have the relation $a_{(i0, \ldots, in-1)} = b_{(in-1, \ldots, i0)}$ if a=bBN. Polar codes can be defined with or without the bit-reversal operation.

For polar code construction, the reliabilities of bit channels are determined. The most reliable K channels are reserved for K information bits. Known bit values are assigned to remaining N−K frozen bit channels. Information bit locations in the uncoded bit vector are the elements of the set A. Frozen bit locations in the uncoded bit vector are the elements of the set $A^c$.

Several decoding methods can be employed to decode polar codes. Example decoding methods are Successive Cancellation (SC) and Successive Cancellation List (SCL) decoding.

SC is a low-complexity algorithm in which bits are decoded sequentially and one at a time. SC decoder takes the channel observations and the frozen bit locations as inputs and calculates the bit estimates. Channel observations may be taken in hard decisions (bits) or soft decisions. In an exemplary embodiment, soft decision form is log-likelihood ratio (LLR), which is defined as:

$$\lambda = \frac{P(y \mid x=0)}{P(y \mid x=1)}$$

In SC decoding, bit decisions are made according to the following pseudocode:

```
for i=0 to N-1 do
    if i ∈ A^C then
        û_i ← u_i
    elseif ln( W_N^(i)(y, u_0^{i-1}|u_i = 0) / W_N^(i)(y, u_0^{i-1}|u_i = 1) ) ≥ 0 then
        û_i ← 0
    else
        û_i ← 1
    end
end
```

Herein, $u_i$ denotes the the i-th uncoded bit, $\hat{u}_i$ denotes the bit estimation for $u_i$ at the decoder output, $W_N^{(i)}(y, u_0^{i-1} \mid u_i = u)$ is the conditional channel transition probability of polarized i-th bit channel. The likelihood functions $$\ln\left( \frac{w_N^{(i)}(y, u_0^{i-1} \mid u_i = 0)}{w_N^{(i)}(y, u_0^{i-1} \mid u_i = 1)} \right)$$

are calculated sequentially in SC decoding.

An SC decoder has a complexity order $O(N \log_2 N)$. A full parallel implementation of SC decoder has 2N−2 latency.

SCL decoding algorithm is based on SC decoding algorithm. SCL decoders achieve better error performance than SC decoders, while having higher complexity than SC decoders.

Storage elements in SCL decoder implementations may be used to store intermediate LLR values, decoded bits and partial-sums of for each of L paths. Storage elements may be register or RAM blocks depending on the hardware architecture. For example, intermediate LLR values are conventionally stored in RANI blocks due to large amounts of bits to be stored. Decoded bits and partial-sum bits may be stored in registers or RAM blocks depending on the architecture, as they do not require as many bits as intermediate LLR values.

Implementations of SCL decoders require copying of contents of storage elements of each path after path pruning stages. L-to-1 multiplexers are used for each of L paths. Input widths of multiplexers are equal to the widths of storage elements. For example, in a hardware design where decoded bits are stored in N-bit registers, L-to-1 multiplexers with input widths of N bits are used to copy registers of each of L paths. For the case in which RANI blocks are used for storage, a method to keep pointer registers may be employed in order to access the contents of correct RANI blocks during decoding. In that case, L-to-1 multiplexers with input widths equal to the width of pointer registers are required for each of L paths.

An important portion of hardware complexity in SCL decoder implementations emerges from multiplexer blocks. Decreasing the complexity of the explained multiplexing operation is expected to reduce the complexity of overall SCL decoder architecture.

In prior art, patent document numbered KR101600759B1 discloses a method and an apparatus to simplify merged processing element for SCL polar decoders. The said apparatus includes a first merged processing calculation part (SM-PE1) which searches for the selection signal of a multiplexer by using an XOR calculation, and a second merged processing calculation part (SM-PE2) which performs a calculation by using a sign bit only in a final step of performing decoding. In this document, hardware complexity resulted from multiplexers is not disclosed.

Patent application document numbered US2016056843A1 discloses a method and a system reducing hardware complexity of polar code decoders. This document addresses to architectures and decoding processes to reduce polar code decoder complexity both in terms of the number of processing elements required, but also the number of memory elements and the number of steps required to decode a codeword. However, similar to the document above, this document does not disclose hardware complexity reduction technique regarding multiplexers either.

Patent application document numbered US2017366204A1 discloses a design for multiple-symbol combination based decoding comprising list decoding.

The paper A. Balatsoukas-Stimming, M. B. Parizi and A. Burg, "LLR-Based Successive Cancellation List Decoding of Polar Codes," in IEEE Transactions on Signal Processing, vol. 63, no. 19, pp. 5165-5179, Oct. 1, 2015 discloses a formulation for successive cancellation list decoding using log-likelihood ratios.

The paper A. Balatsoukas-Stimming, M. Bastani Parizi and A. Burg, "On metric sorting for successive cancellation list decoding of polar codes," 2015 IEEE International Symposium on Circuits and Systems (ISCAS), Lisbon, Portugal, 2015, pp. 1993-1996. discloses an exploitation of the structure of the path metrics in a log-likelihood ratio based formulation of successive cancellation list decoding.

The paper K. Chen, K. Niu and J. Lin, "A Reduced-Complexity Successive Cancellation List Decoding of Polar Codes," 2013 IEEE 77th Vehicular Technology Conference (VTC Spring), Dresden, Germany, 2013, pp. 1-5 discloses a version of successive cancellation list decoding algorithm based on a tree-pruning technique.

The paper J. Chen et al., "Low-Complexity List Successive-Cancellation Decoding of Polar Codes Using List Pruning," 2016 IEEE Global Communications Conference (GLOBECOM), Washington, D.C., USA, 2016, pp. 1-6 discloses a design for successive cancellation list decoding based on a list pruning method.

However, similar to the documents above, this document does not disclose hardware complexity reduction techniques regarding multiplexers either.

SUMMARY

Present invention proposes a hardware complexity reduction method for SCL decoders. This method suggests reducing the input numbers of L multiplexers used in copying operations. In path pruning stages of SCL decoding, L paths with smallest path metrics out of 2L candidate paths are chosen as surviving candidate paths. Moreover, the path indexes of L surviving candidate paths are provided in a sorted manner according to the indexes at the output of a sorter module. After path pruning, instead of L-to-1 multiplexers used in conventional SCL decoders, (L/2+1)-to-1 multiplexers are required to perform copying operations of any required elements stored in registers of continuing and/or duplicated paths.

DESCRIPTION OF REFERENCE NUMBERS

100. Sorter module
200. Extractor module
300. Multiplexer bank
400. Sorter module
500. Multiplexer bank

DETAILED DESCRIPTION OF THE EMBODIMENTS

Hereinafter, the detailed descriptions of the embodiments of the present invention will be given with accompanying drawings.

Figure 1:
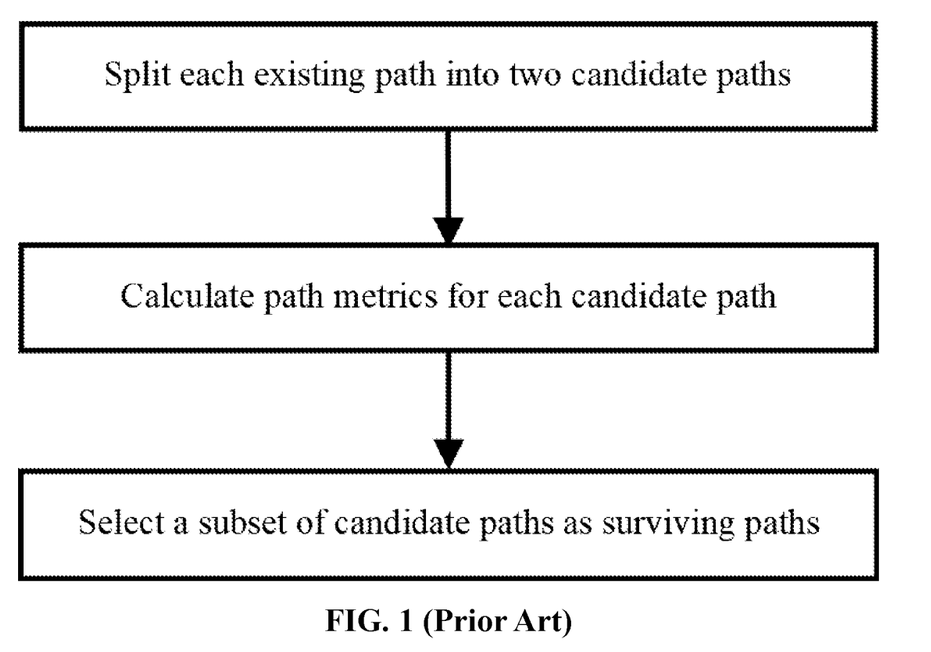
FIG. 1 shows flowchart of decision making procedure in conventional SCL decoding

SCL decoders keep L paths during decoding to improve the error performance. Paths are formed during the decision-making stages of SC decoding, where a SC decoder makes a hard decision and a SCL decoder splits into alternative decision paths. Decision making procedure in SCL decoding is depicted in FIG. 1.

In the first step, an existing path is split into two candidate paths. Splitting is performed when an information bit is decoded. Splitting is performed by considering both bit values of '0' and '1' as bit decisions for the two candidate paths.

In the second step, path metrics are calculated for each candidate path. Path metrics of candidate paths are calculated from path metrics of existing paths from which the candidate paths are formed.

In the last step, a subset of candidate paths is chosen as surviving candidate paths for further calculations. A maximum number of paths is defined as L. If the number of candidate paths is less than L, all candidate paths survive. If the number of candidate paths exceeds L, a SCL decoder performs path pruning. In path pruning, L paths with smallest path metrics are chosen as surviving candidate paths.

Each existing path in a SCL decoder has a path metric. Each candidate path in a SCL decoder has a path metric as well. Path metrics of candidate paths are calculated from path metrics of existing paths which the candidate paths are formed from.

Each existing path in a SCL decoder has intermediate LLR values. Each candidate path in a SCL decoder has intermediate LLR values as well. Intermediate LLR values of candidate paths are the same as those of existing from which the candidate paths are formed.

Each existing path in a SCL decoder has decoded bits. Each candidate path in a SCL decoder has decoded bits as well. Decoded bits of candidate paths are the same as those of existing paths from which the candidate paths are formed, except for most recently decoded bit.

Each existing path in a SCL decoder has partial-sum bits. Each candidate path in a SCL decoder has partial-sum bits as well. Partial-sum bits of candidate paths are calculated from those of existing paths from which the candidate paths are formed.

Figure 2:
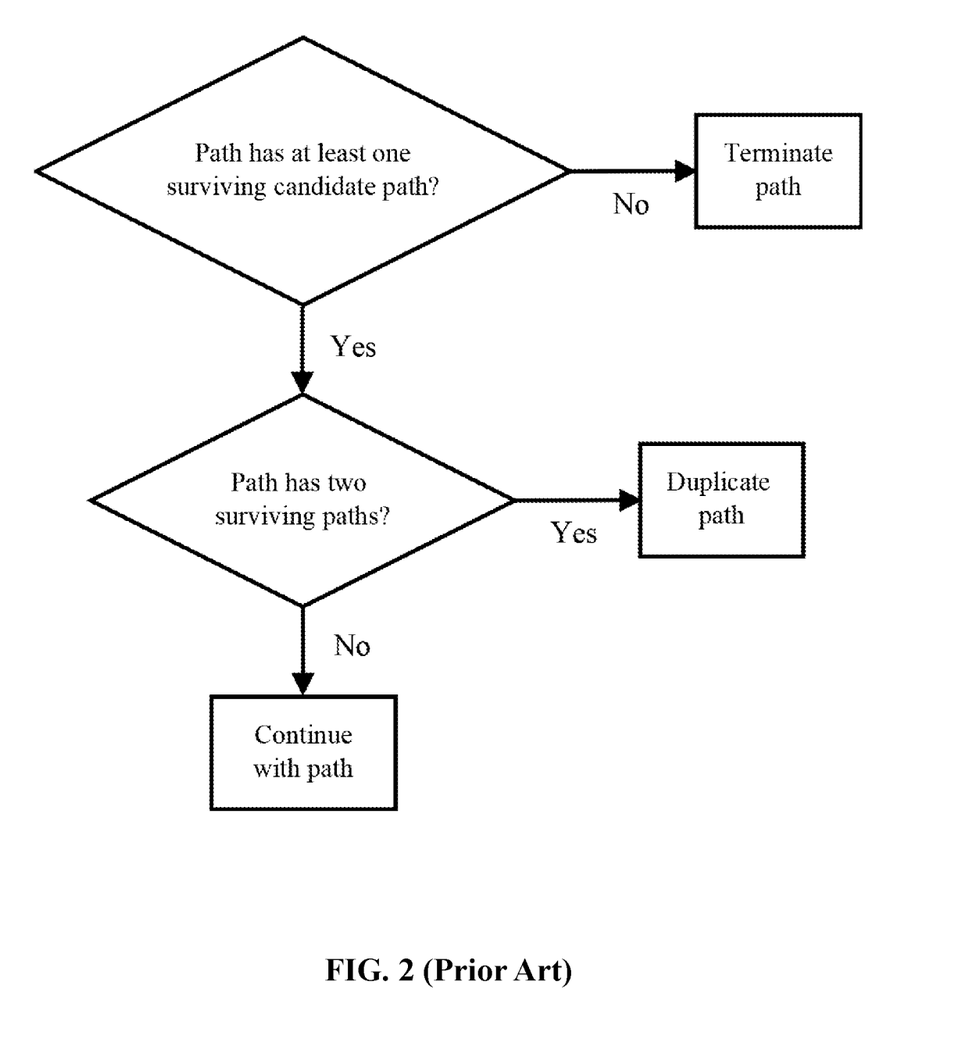
FIG. 2 shows flowchart of path management method for conventional SCL decoding

Because of path pruning, new paths are formed from existing paths. After path pruning, an existing path is either terminated, is duplicated or continues to exist, as shown in FIG. 2. An existing path is terminated if no surviving candidate paths are formed from the existing path. An existing path is duplicated if both candidate paths that are formed from the existing path survive. An existing path continues if only one candidate path that is formed from the existing path survives.

If an existing path is terminated, its intermediate LLR values, decoded bits and partial-sum bits are discarded. If an existing path is duplicated, its intermediate LLR values, decoded bits, and partial-sum bits are duplicated to the two surviving candidate paths that are formed from this path. If an existing path continues, its intermediate LLR values, decoded bits and partial-sum bits are copied to those of the surviving candidate path that is formed from this path.

Figure 3:
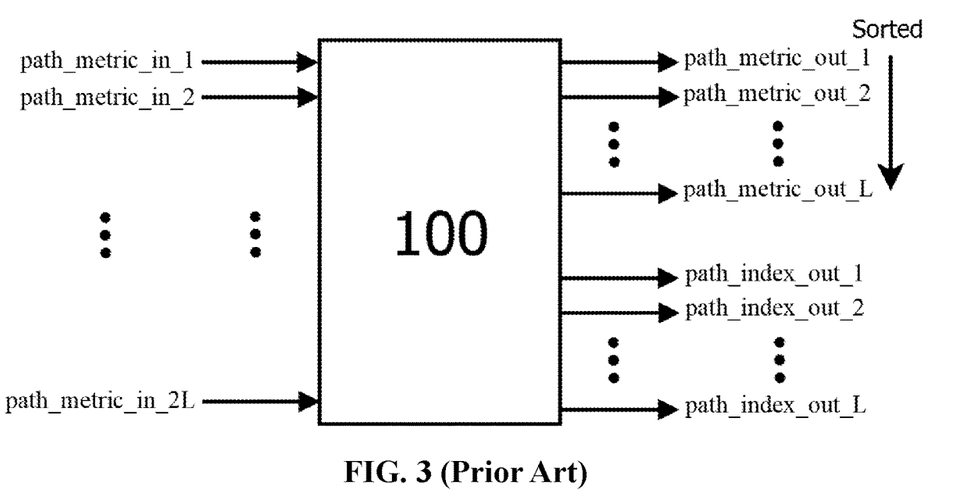
FIG. 3 shows schematic view of sorter deployed in a conventional SCL decoder

In an example hardware implementation of a conventional SCL decoder, in path pruning, a sorter module (100) sorts the path metrics of 2L candidate paths in an ascending order (FIG. 3). L candidate paths with path metrics which are the first L path metrics at the output of a sorter module (100) are chosen as surviving candidate paths. L surviving candidate path indexes are sorted in ascending order of their path metrics.

Figure 4:
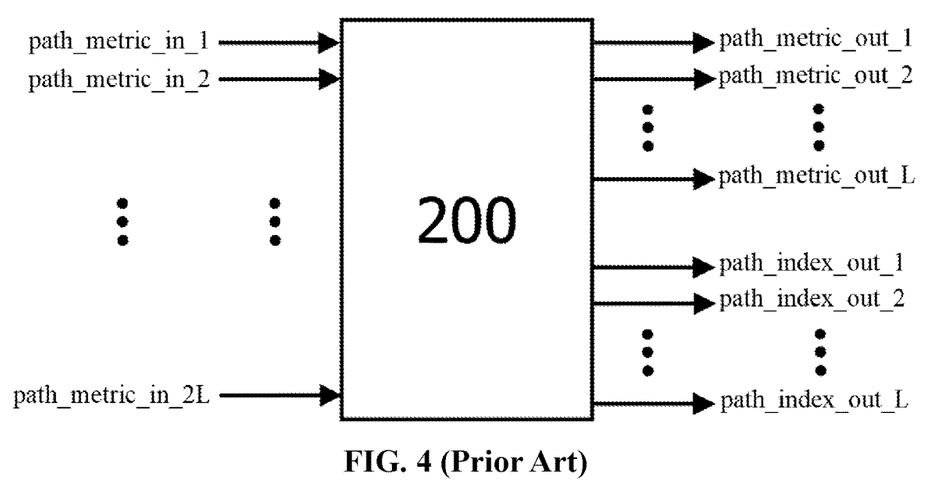
FIG. 4 shows schematic view of extractor deployed in a conventional SCL decoder

In another example hardware implementation of a conventional SCL decoder, in path pruning, an extractor module (200) extracts L smallest path metrics among 2L path metrics (FIG. 4). L candidate paths with path metrics which are the first L path metrics at the output of an extractor module are chosen as surviving candidate paths. L surviving candidate path indexes are not sorted in ascending order of their path metrics.

In an example hardware implementation of a conventional SCL decoder, each path has dedicated storage and processing elements. After path pruning, intermediate LLR values, partial-sums and decoded bits of an existing path, from which one or two surviving paths are formed, need to be copied from its dedicated storage elements to the dedicated storage elements that are assigned to the specific surviving path. Copying operation after path pruning is performed according to the ordering of surviving candidate paths. Herein, the ordering depends on whether a sorter or an extractor module is employed to determine surviving candidate paths.

In an example hardware implementation of a conventional SCL decoder wherein a sorter module (100) is employed, after path pruning, intermediate LLR values, partial-sums and decoded bits of existing paths, from which one or two surviving paths are formed, are copied from their dedicated storage elements to dedicated storage elements assigned to L surviving candidate paths that are sorted in ascending order of their path metrics.

In another example hardware implementation of a conventional SCL decoder wherein an extractor module (200) is employed, after path pruning, intermediate LLR values, partial-sums and decoded bits of existing paths, from which one or two surviving paths are formed, are copied from their dedicated storage elements to dedicated storage elements assigned to L surviving candidate paths that are sorted according to ordering at the output of extractor module (200).

Figure 5:
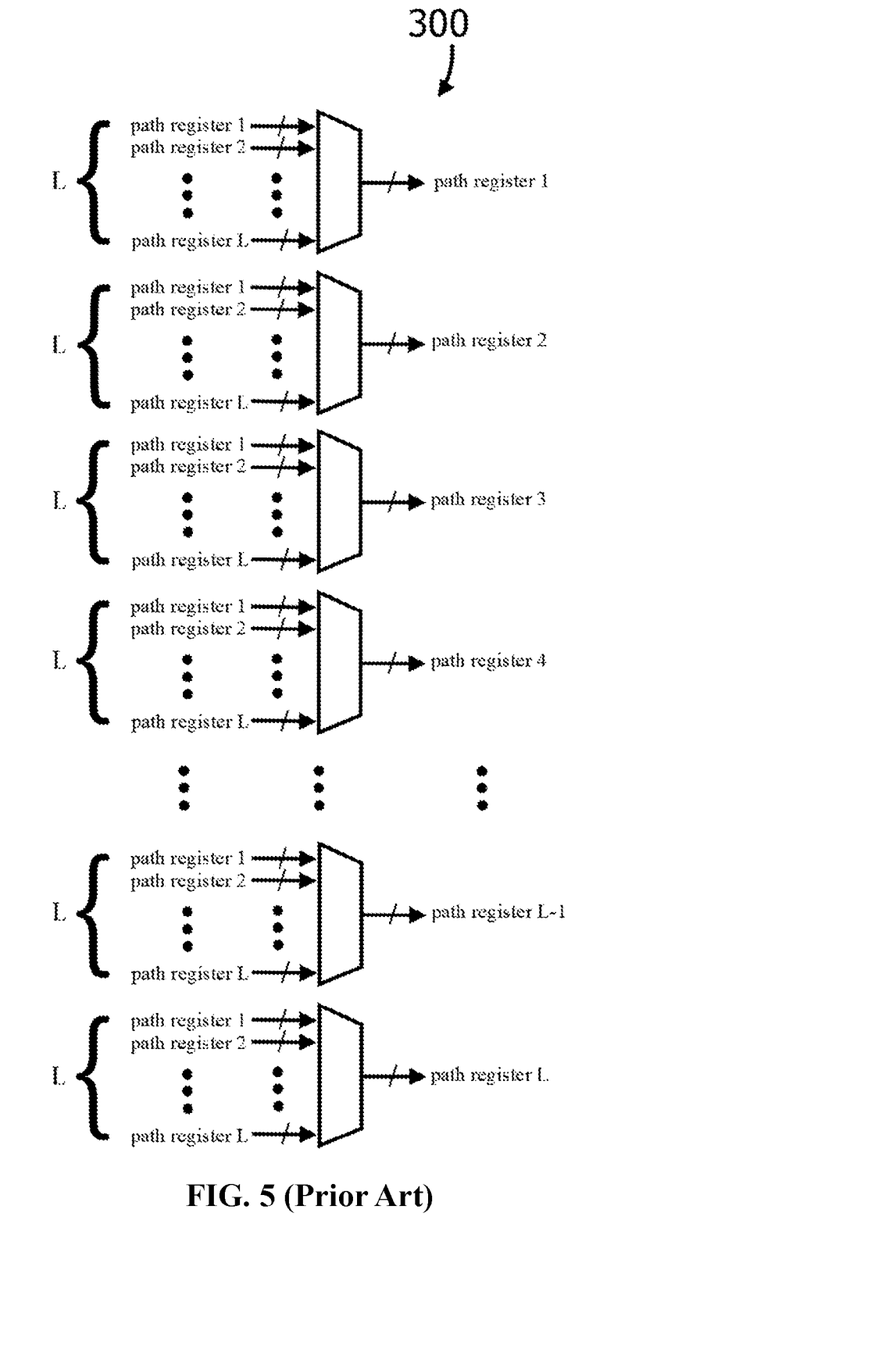
FIG. 5 shows schematic view of multiplexer bank deployed in a conventional SCL decoder

In hardware implementations of a conventional SCL decoder, at least one multiplexer bank (300) having a total number of L L-to-1 multiplexers are deployed to copy storage elements of each path after path pruning according to sorted path indexes of L surviving candidate paths (FIG. 5).

In an example hardware implementation of a conventional SCL decoder, multiplexer bank (300) having a total number of L L-to-1 multiplexers are required to copy intermediate LLR values of existing paths. In an example hardware implementation, input widths of such L-to-1 multiplexers are NQ bits. Herein, Q represents the quantization bit number for intermediate LLR values.

In another example hardware implementation of a conventional SCL decoder, pointer registers are employed to map intermediate LLR RAM blocks to paths. A multiplexer bank (300) having a total number of L L-to-1 multiplexers is deployed to copy pointer registers of existing paths. In an example hardware implementation, input widths of such L-to-1 multiplexers are log 2L(log 2N−1) bits.

In yet another example hardware implementation of a conventional SCL decoder, a multiplexer bank (300) having a total number of L L-to-1 multiplexers is deployed to copy partial-sum bits of existing paths. In an example hardware implementation, inputs of such L-to-1 multiplexers are N bits. In another example hardware implementation, input widths of such L-to-1 multiplexers are N/2 bits.

In another example hardware implementation of a conventional SCL decoder, pointers are employed to map partial-sum RANI blocks to paths. Pointers are stored in registers. A multiplexer bank (300) having a total number of L L-to-1 multiplexers is deployed to copy LLR pointers of existing paths. In an example hardware implementation, input widths of such L-to-1 multiplexers are log 2L(log 2N−1) bits.

In an example hardware implementation of a conventional SCL decoder, a multiplexer bank (300) having a total number of L L-to-1 multiplexers is deployed to copy decoded bits of existing paths. In an example hardware implementation, input widths of such L-to-1 multiplexers are N bits. In another hardware example implementation, input widths of such L-to-1 multiplexers are K bits.

In an example hardware implementation of a conventional SCL decoder, intermediate LLR values of each path are stored in RANI blocks. LLR pointers, decoded bits and partial-sums of each path are stored in registers. LLR pointers are stored in L registers of log 2L(log 2N−1) bits. Decoded bits are stored in L registers of N bits. Partial-sums are stored in L registers of N/2 bits. A total number of L L-to-1 multiplexers with input widths of log 2L(log 2N−1) bits are used to copy LLR pointers. A total number of L L-to-1 multiplexers with input widths of N bits are used to copy decoded bits. A total number of L L-to-1 multiplexers with input widths of N/2 bits are used to copy partial-sum bits.

Figure 6:
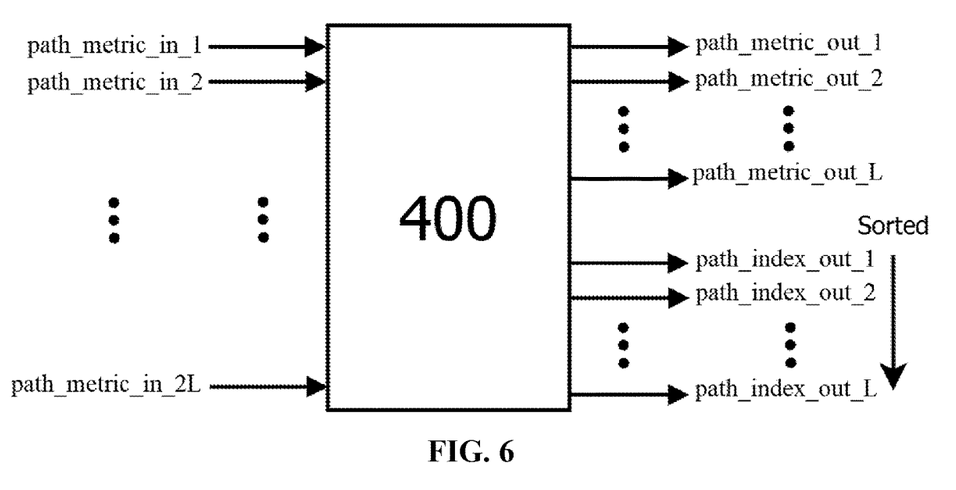
FIG. 6 shows schematic view of the sorter module proposed by present invention

In the present invention, in path pruning, L paths with smallest path metrics out of 2L candidate paths are chosen as surviving candidate paths. As illustrated in FIG. 6, the path indexes of L surviving candidate paths are provided in a sorted manner according to the indexes at the output of a sorter module (400). Path index sorting of L surviving candidate paths may be in ascending or descending order.

Figure 7:
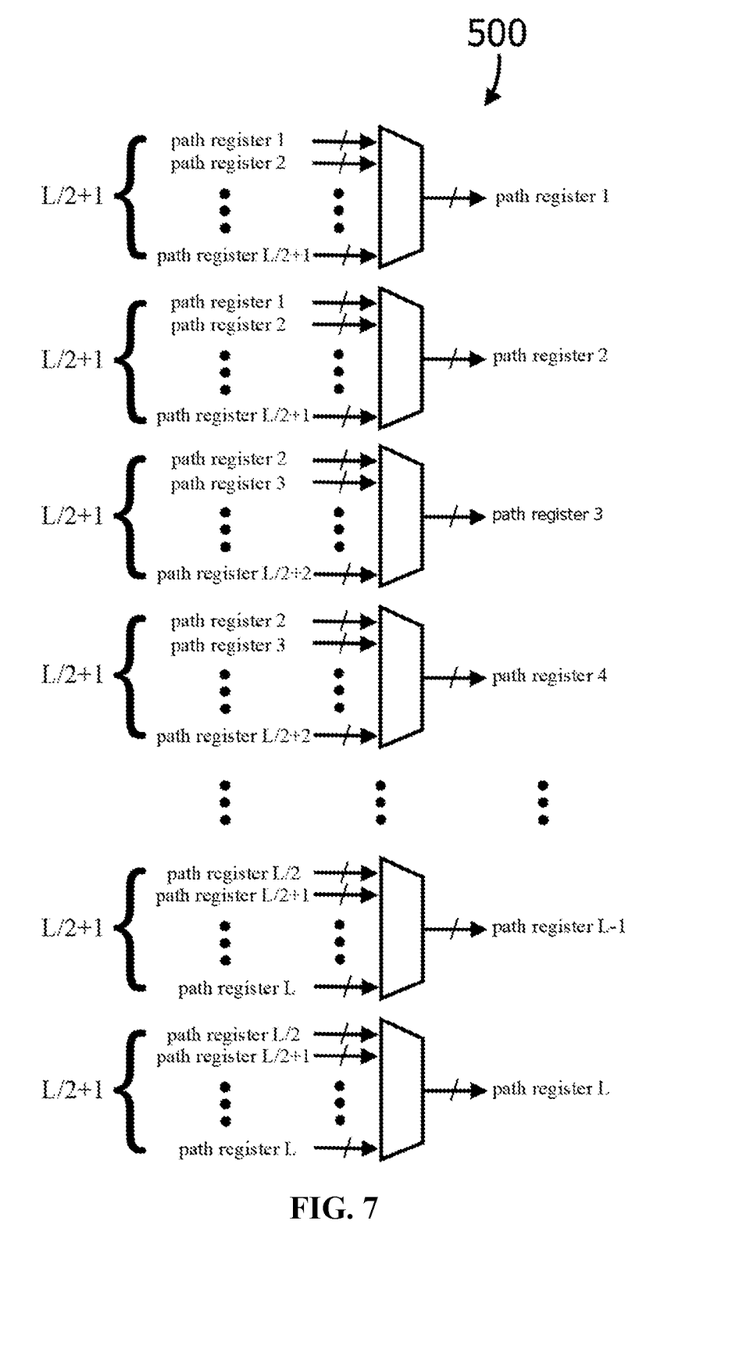
FIG. 7 shows schematic view of the multiplexer bank proposed by present invention

In the present invention, after path pruning, instead of L-to-1 multiplexers, (L/2+1)-to-1 multiplexers are deployed to perform copying operations of any required elements stored in dedicated registers of paths. Copying operations after path pruning can be performed by a multiplexer bank (500) as depicted in FIG. 7. Reduction in multiplexer inputs is obtained by limiting the paths that can be copied to a specific path after path pruning by sorting the surviving candidate path indexes.

In an exemplary embodiment, L is equal to 4. Candidate paths 2i−1 and 2i are split from existing path i at decision stages, for 1≤i≤4. Copying operations to path 1 are considered. Surviving candidate path indexes are sorted in ascending order. For the case where, surviving candidate paths are the candidate paths with indexes 5, 6, 7 and 8, copying operations will be performed from existing paths with indexes 3 and 4. Therefore, copying operations to paths 1, 2, 3 and 4 will be performed from paths 3, 3, 4 and 4, respectively. For any other cases, the existing path indexes to be copied to path 1 will be smaller than 3. This means that no copying operations to path 1 can be performed from path 4 in any case. Therefore, copying operations to path 1 can only be performed from paths 1, 2 and 3 in any case.

In another exemplary embodiment, L is equal to 4. Candidate paths 2i−1 and 2i are split from existing path i at decision stages, for 1≤i≤4. Copying operations to path 1 are considered. Surviving candidate path indexes are sorted in descending order. For the case where, surviving candidate paths are the candidate paths with indexes 4, 3, 2 and 1, copying operations will be performed from existing paths with indexes 1 and 2. Therefore, copying operations to paths 1, 2, 3 and 4 will be performed from paths 2, 2, 1 and 1, respectively. For any other cases, the existing path indexes to be copied to path 1 will be larger than 2. This means that no copying operations to path 1 can be performed from path 1 in any case. Therefore, copying operations to path 1 can only be performed from paths 2, 3 and 4 in any case.

In an exemplary embodiment, L is equal to 8. Candidate paths 2i−1 and 2i are split from existing path i at decision stages, for 1≤i≤8. Copying operations to path 1 are considered. Surviving candidate path indexes are sorted in ascending order. For the case where surviving candidate paths are the candidate paths with indexes 9, 10, 11, 12, 13, 14, 15 and 16, copying operations will be performed from existing paths with indexes 5, 6, 7 and 8. Therefore, copying operations to paths 1, 2, 3, 4, 5, 6, 7 and 8 will be performed from decoding paths 5, 5, 6, 6, 7, 7, 8 and 8, respectively. In any other cases, the existing path indexes to be copied to path 1 will be smaller than 5. This means that no copying operations to path 1 can be performed from paths 6, 7 and 8 in any case. Therefore, copying operation to path 1 can only be performed from paths 1, 2, 3, 4 and 5 in any case.

In another exemplary embodiment, L is equal to 8. Candidate paths 2i−1 and 2i are split from existing path i at decision stages, for 1≤i≤8. Copying operations to path 1 are considered. Surviving candidate path indexes are sorted in descending order. For the case where surviving candidate paths are the candidate paths with indexes 8, 7, 6, 5, 4, 3, 2 and 1, copying operations will be performed from existing paths with indexes 1, 2, 3 and 4. Therefore, copying operations to paths 1, 2, 3, 4, 5, 6, 7 and 8 will be performed from decoding paths 4, 4, 3, 3, 2, 2, 1 and 1, respectively. In any other cases, the existing path indexes to be copied to path 1 will be larger than 4. This means that no copying operations to path 1 can be performed from paths 1, 2 and 3 in any case. Therefore, copying operation to path 1 can only be performed from paths 4, 5, 6, 7 and 8 in any case.

From above examples, path indexes from which copying is possible to a specific path vary with the index of specific path. Thus, instead of using L-to-1 multiplexers, L/2+1 multiplexers can be deployed without any performance loss.

In an example implementation to validate present invention, a SCL decoder is implemented in a semi-parallel architecture with P=32 processing elements. LLR pointers, partial-sums and decoded bits are stored in registers. LLR pointers are stored in L registers of log 2L(log 2N−1) bits, decoded bits are stored in L registers of N bits, partial-sums are stored in L registers of N/2 bits. Sorting operation is carried out by a bitonic extractor for 2L inputs, serially concantenated with another bitonic sorter for L inputs. Bitonic extractor is employed to extract L surviving candidate paths with smallest path metrics out of 2L candidate paths. Outputs of the first bitonic extractor for 2L inputs are path indexes and path metrics of L surviving candidate paths, which are also inputs of second bitonic sorter for L inputs. Second bitonic sorter is employed to sort L surviving candidate paths according to their path indexes. Implementation results are given in below table:

| Implementation Results (Xilinx Zynq XC7Z100FFG900-2) | | | | | | | |
|---|---|---|---|---|---|---|---|
| Decoder | N | L | LUT | FF | BRAM | fop [MHz] | Latency | TP [Mbps] |
| Conventional | 4096 | 4 | 98029 | 27352 | 20.5 | 90.9 | 12928 | 28.8 |
| Proposed | 4096 | 4 | 73701 | 27350 | 20.5 | 75.8 | 12928 | 24.0 |
| Conventional | 4096 | 8 | 201590 | 54371 | 40.5 | 40.5 | 12928 | 12.8 |
| Proposed | 4096 | 8 | 151901 | 54371 | 40.5 | 36.6 | 12928 | 11.6 |
| Conventional | 4096 | 16 | 665569 | 108605 | — | — | 12928 | — |
| Proposed | 4096 | 16 | 524478 | 108604 | — | — | 12928 | — |

The invention claimed is:

1. A successive cancellation list hardware decoder for polar codes, wherein the decoder comprises:
   a sorter module configured to perform a path pruning by choosing L paths with smallest path metrics out of 2L candidate paths as surviving candidate paths, wherein the sorter module is further configured to perform a sorting operation after the path pruning to sort the L surviving candidate paths according to path indexes of the L surviving candidate paths before the path pruning, wherein the sorted L surviving candidate paths are split from other paths;
   at least one multiplexer bank, wherein each of the at least one multiplexer bank includes exactly L multiplexers, and each of the multiplexers is a (L/2+1)-to-1 multiplexer that takes predetermined L/2+1 paths out of the sorted L surviving candidate paths as input, and the at least one multiplexer bank is configured to perform copying operations of contents of dedicated storage elements, wherein the contents of the dedicated storage elements are intermediate Log-Likelihood Ratio values, decoded bits, partial-sums, and pointer registers for each path after the path pruning according to the path indexes of the sorted L surviving candidate paths.

2. The successive cancellation list decoder according to claim 1, wherein the sorter module performs the sorting operation of the path indexes of the L surviving candidate paths in an ascending order.

3. The successive cancellation list decoder according to claim 1, wherein the sorter module performs the sorting operation of the path indexes of the L surviving candidate paths in a descending order.

4. The successive cancellation list decoder according to claim 1, wherein the at least one multiplexer bank has the number of L (L/2+1)-to-1 multiplexers configured to copy intermediate Log-Likelihood Ratio values from the 2L candidate paths.

5. The successive cancellation list decoder according to claim 1, wherein the at least one multiplexer bank has the number of L (L/2+1)-to-1 multiplexers configured to copy the pointer registers from the 2L candidate paths.

6. The successive cancellation list decoder according to claim 1, wherein the at least one multiplexer bank has the number of L (L/2+1)-to-1 multiplexers configured to copy partial sum bits from the 2L candidate paths.

7. The successive cancellation list decoder according to claim 1, wherein the at least one multiplexer bank has the number of L (L/2+1)-to-1 multiplexers configured to copy the decoded bits from the 2L candidate paths.

* * * * *